US 7,615,323 B2

(12) United States Patent
Strehmel et al.

(10) Patent No.: US 7,615,323 B2
(45) Date of Patent: Nov. 10, 2009

(54) LITHOGRAPHIC PRINTING PLATE PRECURSORS WITH OLIGOMERIC OR POLYMERIC SENSITIZERS

(75) Inventors: Bernd Strehmel, Berlin (DE); Harald Baumann, Osterode/Harz (DE); Udo Dwars, Herzberg/Harz (DE); Detlef Pietsch, Badenhausen (DE); Axel Draber, Osterode (DE); Michael Mursal, Horden (DE)

(73) Assignee: Kodak Graphic Communications, GmbH, Osterode (DE)

( * ) Notice: Subject to any disclaimer, the term of this patent is extended or adjusted under 35 U.S.C. 154(b) by 257 days.

(21) Appl. No.: 11/718,809

(22) PCT Filed: Nov. 11, 2005

(86) PCT No.: PCT/EP2005/012136
§ 371 (c)(1),
(2), (4) Date: May 8, 2007

(87) PCT Pub. No.: WO2006/053689
PCT Pub. Date: May 26, 2006

(65) Prior Publication Data
US 2007/0269745 A1 Nov. 22, 2007

(30) Foreign Application Priority Data
Nov. 18, 2004 (DE) .................. 10 2004 055 733

(51) Int. Cl.
*G03F 7/028* (2006.01)
*G03F 7/029* (2006.01)
*G03F 7/031* (2006.01)
*G03F 7/11* (2006.01)
*G03F 7/38* (2006.01)
*G03F 7/40* (2006.01)
*B41C 1/10* (2006.01)

(52) U.S. Cl. ............ 430/18; 430/278.1; 430/302; 430/286.1; 430/281.1; 430/926; 430/920; 430/915; 430/922; 430/916; 522/904; 522/913; 522/9; 522/16; 522/26; 522/23; 522/18; 101/456; 101/463.1

(58) Field of Classification Search .................. None
See application file for complete search history.

(56) References Cited

FOREIGN PATENT DOCUMENTS

EP 1 349 006 10/2003

OTHER PUBLICATIONS

Grant et al (eds), Grant' & Hackh's Chemical Dictionary, fifth ed, "aliphatic", McGraw-Hill Book Company, New York, N.Y., 1987, p. 22.*

Z. Yang et al. "A soluble blue-light-emitting polymer", Macromolecules, vol. 26, 1993, pp. 1188-1190.

A.M. Sarker et al. "Synthesis, characterization, and optical properties of copolymer containing fluorine-substituted distyrylbenzene and non-conjugated spacers" Macromolecules, vol. 32, 1999, pp. 7409-7413.

M. Zheng et al, "Oxadiazole containing conjugated-nonconjugated blue and blue-green light emitting copolymers" Macromolecules, vol. 34, 2001, pp. 4124-4129.

* cited by examiner

*Primary Examiner*—Cynthia Hamilton
(74) *Attorney, Agent, or Firm*—J. Lanny Tucker

(57) ABSTRACT

Lithographic printing plate precursor comprising (a) a lithographic substrate with a hydrophilic surface and (b) a radiation-sensitive coating on the hydrophilic surface comprising (i) one or more types of monomers and/or oligomers and/or polymers, each comprising at least one ethylenically unsaturated group accessible to a free radical polymerization, (ii) at least one sensitizer, and at least one coinitiator capable of forming free radicals together with the sensitizer (ii); characterized in that the at least one sensitizer is an oligomeric or polymeric compound comprising the following structural unit (Formula (I)), wherein $\pi_1$ is an aromatic or heteroaromatic unit or a combination of the two so that a conjugated π-system is present between the two groups Z in structure (I), each Z independently represents a heteroatom, each $R^1$ and $R^2$ is independently selected from a halogen atom, an alkyl, aryl, alkylaryl or aralkyl group, a group $-NR^3R^4$ and a group $-OR^5$, each $R^3$, $R^4$ and $R^5$ is independently selected from an alkyl, aryl, alkylaryl and aralkyl group, a and b independently represent 0 or an integer from 1 to 4, n has a value of >1 and AS is an aliphatic spacer.

20 Claims, 1 Drawing Sheet

LITHOGRAPHIC PRINTING PLATE PRECURSORS WITH OLIGOMERIC OR POLYMERIC SENSITIZERS

Figure 1:
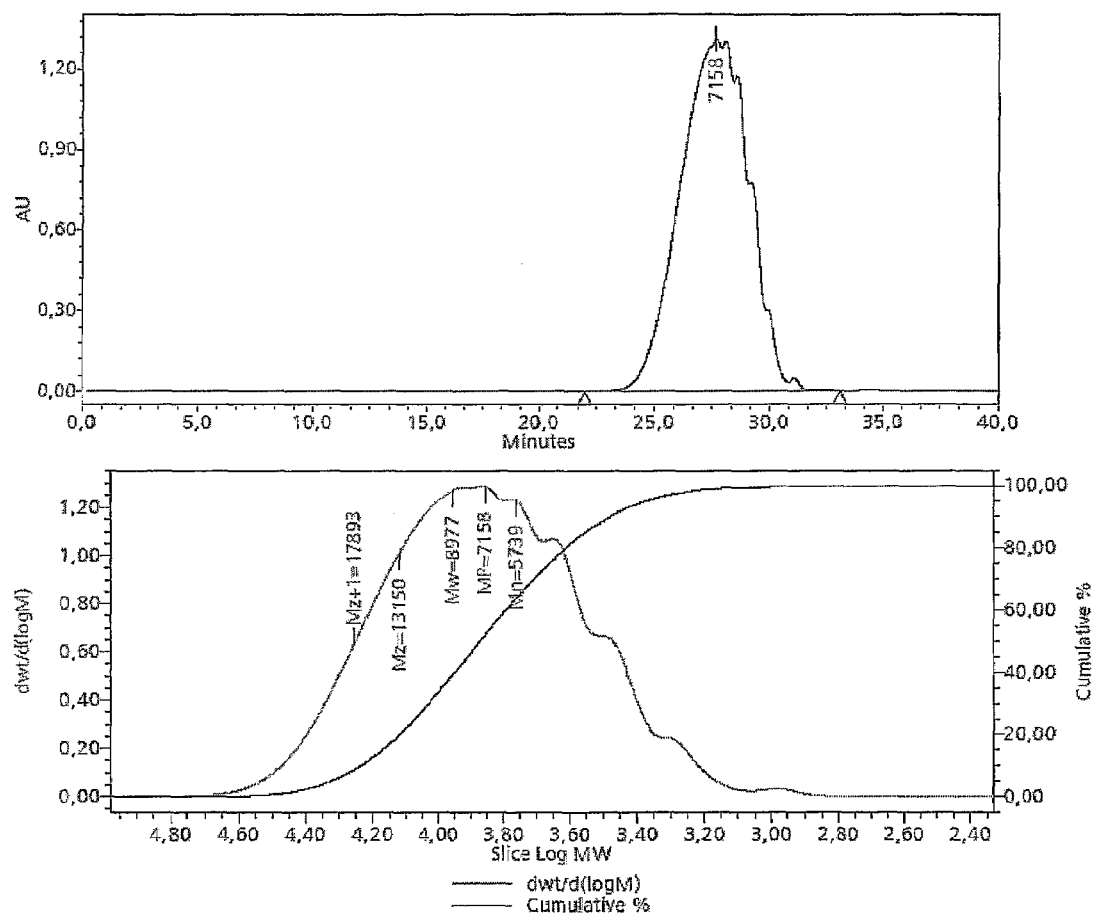

The present invention relates to lithographic printing plate precursors whose radiation-sensitive coating comprises an oligomeric or polymeric sensitizer. The invention furthermore relates to a process for the production of such precursors, a process for imaging such precursors and an imaged printing form.

The technical field of lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as blanket, which then in turn transfers the printing ink onto the surface of the material on which the image is to be formed; this technique is referred to as offset lithography.

A frequently used type of lithographic printing plate precursor comprises a photosensitive coating applied onto a substrate on aluminum basis. The coating can react to radiation such that the exposed portion becomes so soluble that it is removed during the developing process. Such a plate is referred to as positive working. On the other hand, a plate is referred to as negative working if the exposed portion of the coating is hardened by the radiation. In both cases, the remaining image area accepts printing ink, i.e. is oleophilic, and the non-image area (background) accepts water, i.e. is hydrophilic. The differentiation between image and non-image areas takes place during exposure, for which a film is attached to the printing plate precursor under vacuum in order to guarantee good contact. The plate is then exposed by means of a radiation source. Alternatively, the plate can also be exposed digitally without a film, e.g. with a UV laser. When a positive plate is used, the area on the film corresponding to the image on the plate is so opaque that the light does not reach the plate, while the area on the film corresponding to the non-image area is clear and allows light to permeate the coating, whose solubility increases. In the case of a negative plate, the opposite takes place: The area on the film corresponding to the image on the plate is clear, while the non-image area is opaque. The coating beneath the clear film area is hardened due to the incident light, while the area not affected by the light is removed during developing. The light-hardened surface of a negative working plate is therefore oleophilic and accepts printing ink, while the non-image area that used to be coated with the coating removed by the developer is desensitized and therefore hydrophilic.

Photosensitive mixtures have been used for years in photopolymerizable compositions for the production of photosensitive materials such as e.g. printing plate precursors. However, an improved sensitivity in particular in the UV and visible spectral ranges is required for new and advanced applications (e.g. exposure by means of lasers) so that the exposure time can be shortened. From an economic point of view it is of interest to use radiation sources with a reduced photon output instead of high-performance lasers since they are less expensive at the present time. Therefore, efforts have been made for some time to increase the sensitivity of photosensitive mixtures that are to be used in photopolymerizable compositions.

U.S. Pat. No. 3,912,606 describes UV-hardenable compositions for films and coatings which in addition to ethylenically unsaturated monomers comprise a photoinitiator selected from haloalkyl benzoxazoles, benzimidazoles and benzothiazoles. In these compositions as well, the efficiency of the photoinitiator is insufficient.

EP-A-0 741 333 describes photopolymerizable compositions which in addition to ethylenically unsaturated monomers and organic binders comprise a combination of an optical brightener and a photoinitiator selected from acyl and diacyl phosphine oxides. As optical brighteners, those comprising a stilbene, triazine, thiazole, benzoxazole, coumarin, xanthene, triazole, oxazole, thiophene or pyrazoline unit are listed. However, based on today's standards, these photopolymerizable compositions do not exhibit sufficient sensitivity.

U.S. Pat. No. 3,647,467 describes "photo-activable" compositions comprising a hexaarylbiimidazole and a heterocyclic compound $Ar^1$—G—$Ar^2$ (wherein $Ar^1$ is an aryl group with 6 to 12 ring carbon atoms, $Ar^2$ is either $Ar^1$ or a group arylene-G—$Ar^1$ and G is a divalent furan, oxazole or oxadiazole ring). However, the radiation sensitivity of these compositions does not meet present-day requirements.

U.S. Pat. No. 6,267,913 B1 and WO 02/079691 A1 describe compounds which are said to be suitable for a simultaneous 2-photon absorption. No radiation-sensitive compositions with oligomeric or polymeric sensitizers containing an aliphatic spacer are described, nor are lithographic printing plate precursors. The compounds described in these documents are for example sulfonium salts.

It is the object of the present invention to provide lithographic printing plate precursors which show a high degree of radiation sensitivity in combination with good storage stability and excellent resolution and allow the printing of a high number of copies on the printing machine; furthermore, the sensitizer used therein should dissolve well in the coating composition so that problems during the production of the printing plate precursor can be avoided.

The object of the invention is achieved by a lithographic printing plate precursor comprising (a) a lithographic substrate with a hydrophilic surface and (b) a radiation-sensitive coating on the hydrophilic surface comprising
   (i) one or more types of monomers and/or oligomers and/or polymers, each comprising at least one ethylenically unsaturated group accessible to a free-radical polymerization,
   (ii) at least one sensitizer,
   (iii) at least one coinitiator capable of forming free radicals together with the sensitizer (ii) and
   (iv) optionally one or more components selected from alkali-soluble binders, dyes, exposure indicators, plasticizers, chain transfer agents, leuco dyes, surfactants, inorganic fillers and thermopolymerization inhibitors, characterized in that the at least one sensitizer is an oligomeric or polymeric compound comprising the following structural unit (I)

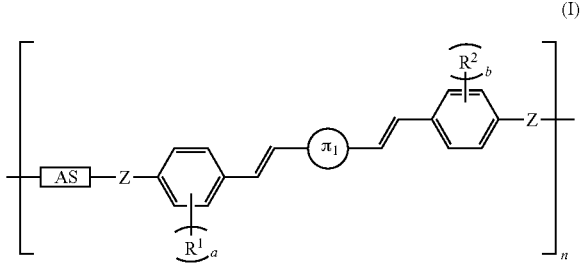

wherein ⑤ is an aromatic or heteroaromatic unit or a combination of the two so that a conjugated π-system is present between the two groups Z in structure (I), each Z independently represents a heteroatom, each $R^1$ and $R^2$ is independently selected from a halogen atom, an allyl, aryl, alkylaryl or aralkyl group, a group —$NR^3R^4$ and a group —$OR^5$, each $R^3$, $R^4$ and $R^5$ is independently selected from an alkyl, aryl, alkylaryl and aralkyl group, a and b independently represent 0 or an integer from 1 to 4, n has a value of >1 and AS is an aliphatic spacer.

FIG. 1 shows the GPC results for sensitizer Ia according to the present invention.

Unless defined otherwise, the term "alkyl group" as used in the present invention refers to a straight-chain, branched or cyclic saturated hydrocarbon group preferably comprising 1 to 18 carbon atoms, especially preferred 1 to 10 carbon atoms and most preferred 1 to 6 carbon atoms. The alkyl group can optionally comprise one or more substituents (preferably 0 or 1 substituent) selected for example from halogen atoms (fluorine, chlorine, bromine, iodine), CN, $NO_2$, $NR^7_2$, $COOR^7$ and $OR^7$ ($R^7$ independently represents a hydrogen atom, an alkyl group or an aryl group). The above definition also applies to the alkyl unit of an alkylene group, an aralkyl group, an alkylaryl group and an alkoxy group.

Unless defined otherwise, the term "aryl group" as used in the present invention refers to an aromatic carbocyclic group with one or more fused rings, which preferably comprises 5 to 14 carbon atoms. The aryl group can optionally comprise one or more substituents (preferably 0 to 3) selected for example from halogen atoms, alkyl groups, alkoxy groups, CN, $NO_2$, $NR^7_2$, $COOR^7$ and $OR^7$ (wherein each $R^7$ is independently selected from hydrogen, alkyl and aryl). The above definition also applies to the aryl unit of an aralkyl group, an alkylaryl group and an aryloxy group. Preferred examples include a phenyl group and a naphthyl group which can optionally be substituted.

A fused ring or ring system as referred to in the present invention is a ring that shares two carbon atoms with the ring to which it is fused.

Unless defined otherwise, the term "heteroaromatic group" as used in the present invention refers to a 5- to 7-membered (preferably 5- or 6-membered) aromatic ring, wherein one or more ring carbon atoms are replaced with heteroatoms selected from N, $NR^7$, S and O (preferably N or $NR^7$). The heteroaromatic ring can optionally comprise one or more substituents, selected for example from alkyl groups, aryl groups, aralkyl groups, halogen atoms, —$OR^7$, —$NR^7_2$, —$C(O)OR^7$, $C(O)NR^7_2$ and CN. Each group $R^7$ is independently selected from hydrogen, alkyl, aryl and aralkyl.

All monomers, oligomers and polymers which are free-radical polymerizable and comprise at least one C—C double bond can be used as ethylenically unsaturated monomers, oligomers and polymers. Monomers/oligomers/polymers with C—C triple bonds can also be used, but they are not preferred. Suitable compounds are well known to the person skilled in the art and can be used in the present invention without any particular limitations. Esters of acrylic and methacrylic acids, itaconic acid, crotonic acid, isocrotonic acid, maleic acid and fumaric acid with one or more unsaturated groups in the form of monomers, oligomers or prepolymers are preferred. They may be present in solid or liquid form, with solid and highly viscous forms being preferred. Compounds suitable as monomers include for instance trimethylol propane triacrylate and trimethacrylate, pentaerythritol triacrylate and trimethacrylate, dipentaerythritolmonohydroxy pentaacrylate and pentamethacrylate, dipentaerythritol hexaacrylate and hexamethacrylate, pentaerythritol tetraacrylate and tetramethacrylate, ditrimethylol propane tetraacrylate and tetramethacrylate, diethyleneglycol diacrylate and dimethacrylate, triethyleneglycol diacrylate and dimethacrylate or tetraethyleneglycol diacrylate and dimethacrylate. Suitable oligomers and/or prepolymers are for example urethane acrylates and methacrylates, epoxide acrylates and methacrylates, polyester acrylates and methacrylates, polyether acrylates and methacrylates or unsaturated polyester resins.

In addition to monomers and/or oligomers, use can also be made of polymers comprising free-radical polymerizable C—C double bonds in the main or side chains. Examples thereof include reaction products of maleic acid anhydride copolymers and hydroxyalkyl(meth)acrylates (cf. e.g. DE-A-4 311 738); (meth)acrylic acid polymers, partially or fully esterified with allyl alcohol (cf. e.g. DE-A-3 332 640); reaction products of polymeric polyalcohols and isocyanatoalkyl (meth)acrylates; unsaturated polyesters; (meth)acrylate-terminated polystyrenes, poly(meth)acrylic acid ester, poly (meth)acrylic acids, poly(meth)acrylamides; (meth)acrylic acid polymers, partially or fully esterified with epoxides comprising free-radical polymerizable groups; and polymers with allyl side-groups which can for example be obtained by polymerization of allyl(meth)acrylate, optionally with further comonomers.

Free-radical polymerizable compounds that can be used in the present invention also include compounds that have a molecular weight of 3,000 or less and are reaction products obtained by reacting a diisocyanate with (i) an ethylenically unsaturated compound with a hydroxy group, and at the same time (ii) a saturated organic compound with an NH group and an OH group, wherein the reactants are used in amounts according to the following condition:

Number of moles of isocyanate groups ≦ number of moles of OH plus NH groups.

Examples of diisocyanates are represented by the following formula:

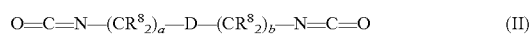

$$O=C=N-(CR^8_2)_a-D-(CR^8_2)_b-N=C=O \quad (II)$$

wherein a and b independently represent 0 or an integer from 1 to 3, each $R^8$ is independently selected from H and $C_1$-$C_3$ alkyl and D is a saturated or unsaturated spacer which can optionally comprise further substituents in addition to the two isocyanate groups. D can be a chain-shaped or a ring-shaped unit. As used in the present invention, the term "diisocyanate" refers to an organic compound comprising two isocyanate groups but no OH groups and no secondary and primary amino groups.

$R^8$ is preferably H or $CH_3$.

a and b are preferably independently 0 or 1.

D can for example be an alkylene group $(CH_2)_w$, wherein w is an integer from 1 to 12, preferably 1 to 6, and one or more hydrogen atoms are optionally replaced with substituents such as e.g. alkyl groups (preferably $C_1$-$C_6$), a cycloalkylene group, an arylene group or a saturated or unsaturated heterocyclic group.

Suitable diisocyanates are for example the following:
Trimethylhexamethylene diisocyanate
1,6-bis-[isocyanate]-hexane 5-isocyanate-3-(isocyanatomethyl)-1,1,3-trimethylcyclohexane
1,3-bis-[5-isocyanate-1,1,3-trimethyl-phenyl]-2,4-dioxo-1,3-diazetidine
3,6-bis-[9-isocyanatononyl]-4,5-di-(1-heptenyl)-cyclohexene
bis-[4-isocyanate-cyclohexyl]-methane
trans-1,4-bis-[isocyanate]-cyclohexane
1,3-bis-[isocyanatomethyl]-benzene
1,3-bis-[1-isocyanate-1-methyl-ethyl]-benzene
1,4-bis-[2-isocyanatoethyl]-cyclohexane
1,3-bis-[isocyanatomethyl]cyclohexane
1,4-bis-[1-isocyanate-1-methyl-ethyl]benzene
bis-[isocyanate]-isododecyl-benzene
1,4-bis-[isocyanate]-benzene
2,4-bis-[isocyanate]-toluene
2,6-bis-[isocyanate]-toluene
N,N'-bis-[3-isocyanate-4-methyl-phenyl]urea
1,3-bis-[3-isocyanate-4-methyl-phenyl]-2,4-dioxo-1,3-diazetidine
bis-[2-isocyanate-phenyl]-methane
(2-isocyanate-phenyl)-(4-isocyanate-phenyl)-methane
bis-[4-isocyanate-phenyl]-methane
1,5-bis-[isocyanate]-naphthalene
4,4'-bis-[isocyanate]-3,3'-dimethyl-biphenyl The ethylenically unsaturated compound (i), which comprises a hydroxy group, comprises at least one non-aromatic C—C double bond, which is preferably terminal. The hydroxy group is preferably not bonded to a double-bonded carbon atom; the hydroxy group is not part of a carboxy group. In addition to the one OH group, the ethylenically unsaturated compound (i) does not comprise any further functional groups, such as e.g. NH, which can react with the isocyanate.

Examples of the ethylenically unsaturated compound (i) include

Hydroxy($C_1$-$C_{12}$)alkyl(meth)acrylates (e.g. 2-hydroxyethyl(meth)acrylate, 2- or 3-hydroxy-propyl(meth)acrylate, 2-, 3- or 4-hydroxybutyl(meth)acrylate), hydroxy($C_1$-$C_{12}$)alkyl-(meth)acrylamides (e.g. 2-hydroxyethyl(meth)acrylamide, 2- or 3-hydroxypropyl(meth)-acrylamide, 2-, 3- or 4-hydroxybutyl(meth)acrylamide), mono(meth)acrylates of oligomeric or polymeric ethylene glycols or propylene glycols (e.g. polyethylene glycol mono(meth)acrylate, triethylene glycol mono(meth)acrylate, allyl alcohol, pentaerythritol tri(meth)acrylate, 4-hydroxy($C_1$-$C_{12}$)alkylstyrene (e.g. 4-hydroxymethylstyrene), 4-hydroxystyrene, hydroxycyclohexyl(meth)acrylate.

The term "(meth)acrylate" etc. as used in the present invention indicates that both methacrylate and acrylate etc. are meant.

The saturated compound (ii) is a compound with one OH and one NH group.

The saturated organic compound (ii) can for example be represented by the following formula (III) or (IV)

$$R^9\text{—}N\text{—}E\text{—}OH$$
$$|$$
$$H$$
(III)

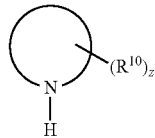
(IV)

wherein $R^9$ is a straight-chain (preferably $C_1$-$C_{12}$, especially preferred $C_1$-$C_4$), branched (preferably $C_3$-$C_{12}$, especially preferred $C_3$-$C_6$) or cyclic (preferably $C_3$-$C_8$, especially preferred $C_5$-$C_6$) alkyl group, E is a straight-chain (preferably $C_1$-$C_6$, especially preferred $C_1$-$C_2$), branched (preferably $C_3$-$C_{12}$, especially preferred $C_3$-$C_6$) or cyclic (preferably $C_3$-$C_8$, especially preferred $C_5$-$C_6$) alkylene group,

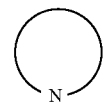

represents a saturated heterocyclic ring with 5 to 7 ring atoms, which in addition to the nitrogen atom shown above optionally comprises a further heteroatom selected from S, O and $NR^{11}$, wherein $R^{11}$ is an allyl group optionally substituted with an OH group, $R^{10}$ is OH or a straight-chain, branched or cyclic alkyl group substituted with an OH group, and z=0 if the heterocyclic ring comprises $NR^{11}$ and $R^{11}$ is an alkyl group substituted with OH and z=1 if the saturated heterocyclic ring does not comprise $NR^{11}$ or if the saturated heterocyclic ring comprises $NR^{11}$ and $R^{11}$ is an unsubstituted alkyl group.

Of the compounds of formula (III), those are preferred wherein E represents —$CH_2CH_2$— and $R^9$ is a straight-chain $C_1$-$C_{12}$ (preferably $C_1$-$C_4$) alkyl group.

Of the compounds of formula (IV), those are preferred wherein either no additional heteroatom is present in the ring and $R^{10}$ is an alkyl group substituted with OH (i.e. hydroxyalkyl-substituted piperidines), or a group $NR^{11}$ is present in the ring and $R^{11}$ is an alkyl group substituted with OH (i.e. N-hydroxyalkyl-substituted piperazines).

In particular, the following compounds should be mentioned as compound (ii):
2- or 3-(2-hydroxyethyl)piperidine,
2- or 3-hydroxymethylpiperidine,
N-(2-hydroxyethyl)piperazine and
N-(2-hydroxymethyl)piperazine.

The number of moles of isocyanate groups must not exceed the number of moles of OH groups and NH groups combined since the product should not comprise any more free isocyanate groups.

The reaction of the diisocyanate and the ethylenically unsaturated compound (i) and the saturated compound (ii) usually takes place in an aprotic solvent such as a ketone (e.g. acetone, methyl ethyl ketone, diethyl ketone, cyclopentanone and cyclohexanone), an ether (e.g. diethyl ether, diisopropyl ether, tetrahydrofuran, dioxane and 1,2-dioxolane) and an ester (e.g. ethyl acetate, methyl acetate, butyl acetate, ethylene glycol diacetate, methyl lactate and ethyl lactate) or in a technical solvent such as ethylene glycol monomethyl ether acetate, propylene glycol monomethyl ether acetate etc.

It is preferred to use a catalyst for condensation reactions. All known catalysts suitable for condensation reactions can be used. Examples include tertiary amines, such as triethylamine, pyridine etc. and tin compounds, such as dibutyltin dilaurate.

The reaction preferably takes place at 10 to 120° C., especially preferred at 30 to 70° C.

Under optimized synthesis conditions a uniform product can be obtained. However, as a rule it has to be assumed that a mixed product is formed. The molecular weight of the product should be 3,000 or less. In the case of a mixed product, the molecular weight is the weight-average molecular weight. Both a uniform reaction product and a mixed product can be used as a free-radical polymerizable compound in the present invention.

Additional suitable C—C unsaturated free-radical polymerizable compounds are described e.g. in EP-A-1 176 007.

It is of course possible to use different kinds of monomers, oligomers or polymers in the mixture; furthermore, mixtures of monomers and oligomers and/or polymers can be used in the present invention, as well as mixtures of oligomers and polymers. The free-radical polymerizable monomers/oligomers/polymers are preferably present in an amount of 5 to 95 wt.-%; if monomers/oligomers are used, especially preferred 20 to 85 wt.-%, based on the dry layer weight of a radiation-sensitive coating prepared from the radiation-sensitive composition of the present invention. As used in the present invention, the term "dry layer weight of the radiation-sensitive coating" is therefore synonymous with the term "solids of the radiation-sensitive composition".

A sensitizer as referred to in the present invention is a compound which can absorb radiation when it is exposed but which cannot by itself, i.e. without the addition of coinitiators, form free radicals.

In the present invention, one sensitizer or a mixture of two or more can be used.

In the present invention, an oligomeric or polymeric compound is used as a sensitizer which comprises the following structural unit (I)

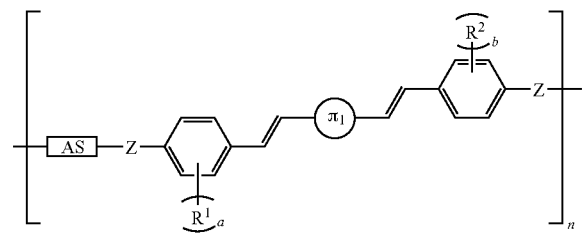

(I)

wherein ⑤ is an aromatic or heteroaromatic unit or a combination of the two so that a conjugated π-system is present between the two groups Z in structure (I), each Z independently represents a heteroatom connecting the spacer AS and the conjugated system, each $R^1$ and $R^2$ is independently selected from a halogen atom, an alkyl, aryl, alkylaryl or aralkyl group, a group —$NR^3R^4$ and a group —$OR^5$, each $R^3$, $R^4$ and $R^5$ is independently selected from an alkyl, aryl, alkylaryl and aralkyl group, a and b independently represent 0 or an integer from 1 to 4, n has a value of >1 and AS is an aliphatic spacer.

⑤ is preferably derived from benzene, naphthalene, anthracene, fluoren, biphenyl, carbazole, furan, dibenzofuran, thiophene, dibenzothiophene, dithienothiophene, oxadiazole, thiadiazole, pyridine, pyrimidine and combinations of two or more of the above groups which may be the same or different.

The aromatic or heteroaromatic unit ⑤ can optionally comprise one or more substituents selected from halogen atoms, alkyl, aralkyl, alkoxy and aryloxy groups.

Z represents a heteroatom which is preferably selected from O, N, S and Si, more preferred, Z is O or S and most preferred Z is O.

$R^1$ and $R^2$ are preferably independently selected from halogen atoms, alkyl and a group —$OR^5$, more preferred from a group —$OR^5$; it is particularly preferred that $R^1$ and $R^2$ are the same.

The groups $R^3$, $R^4$ and $R^5$ are preferably independently selected from alkyl and alkylaryl, especially preferred from $C_1$-$C_6$ alkyl.

a and b are preferably independently 0, 1 or 2, especially preferred 0 or 1; it is particularly preferred that a and b are the same.

n represents an average value and preferably has a value in the range of 2 to 25.

The aliphatic spacer AS is preferably a group $-\!\!\{(CH_2)_y\!-\!O\}_z\!-\!(CH_2)_x\!\}\!-$ wherein x and y each independently represents an integer of at least 1 (it is especially preferred that y is 2 or 3, x is preferably an integer from 2 to 12) and z represents an integer $\geq 0$ (it is especially preferred that z is 0, 1, 2, 3 or 4; if z≠0, x is preferably 2 and if z=0, x is preferably an integer from 4 to 12), a group

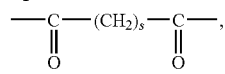

wherein s is an integer of at least 1 (it is especially preferred that s is 2 to 6), a siloxane unit or a silane unit.

It is especially preferred that the aliphatic spacer is —CO—(—$CH_2$—)$_4$—CO—, —($CH_2$)$_8$— or $-\!\!\{(CH_2)_2\!-\!O\}_2\!-\!(CH_2)_2\!\}\!-$.

Preferably, the molecular weight of the sensitizer (weight average determined by means of gel permeation chromatography using polystyrene standards) is at least 500 g/mol, preferably at least 1,000 g/mol, and most preferred in the range of 5,000 to 30,000.

Sensitizers which only consist of structural units (I), i.e. do not comprise any other structural units, are especially preferred.

Examples of suitable sensitizers are those comprising one or more of the following structural units (Ia)-(Ii) and preferably consisting of only one or more of these units:

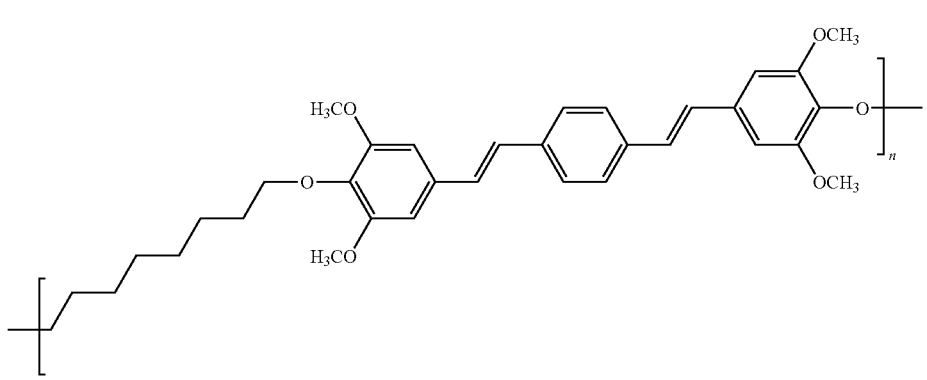

Ia

-continued
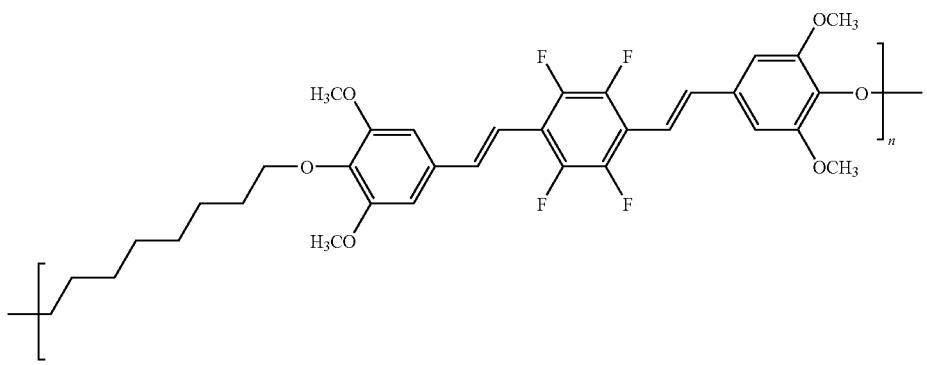
Ib
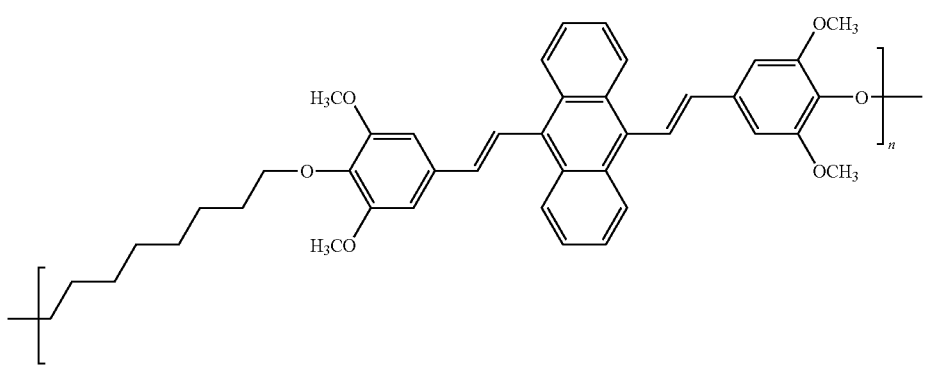
Ic
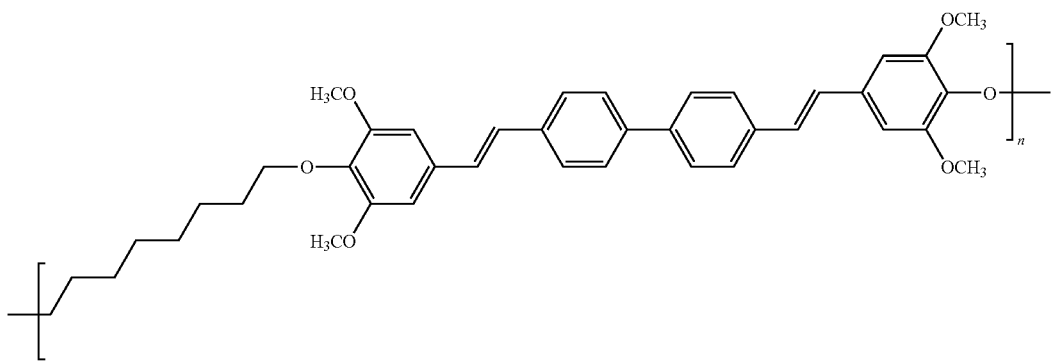
Id
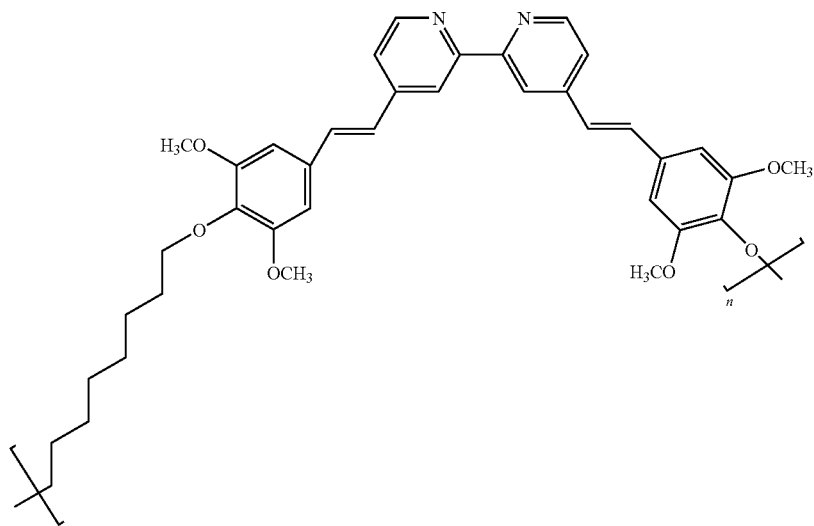
Ie

-continued
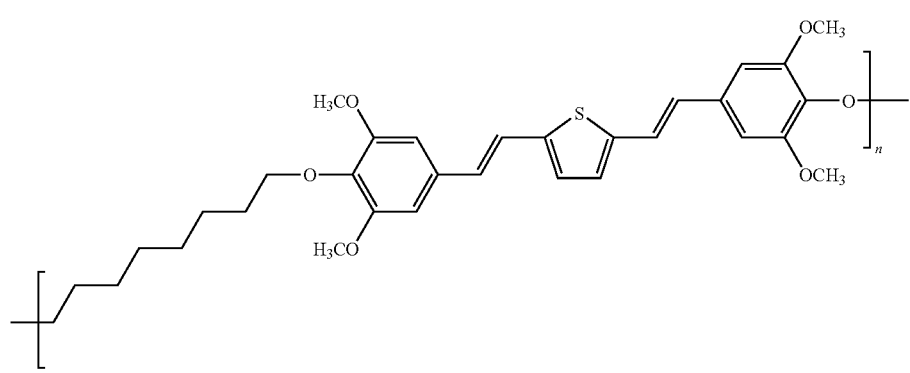
If
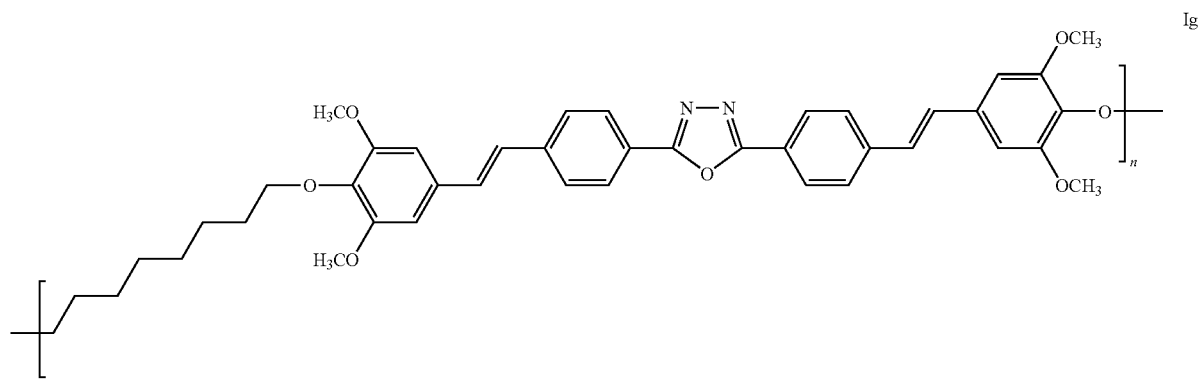
Ig
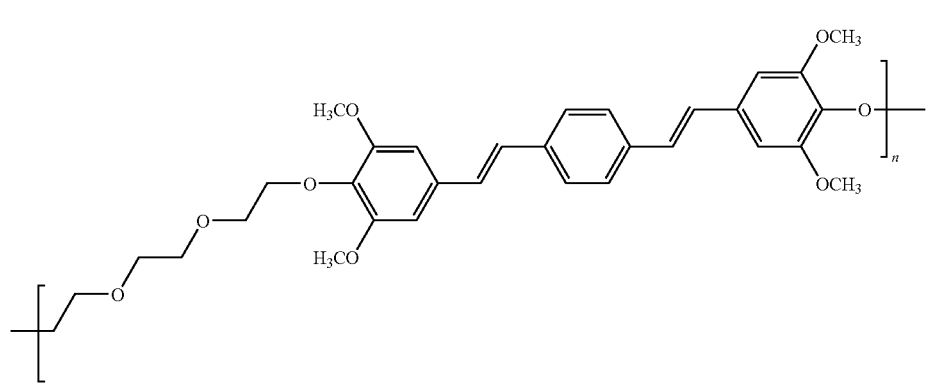
Ih
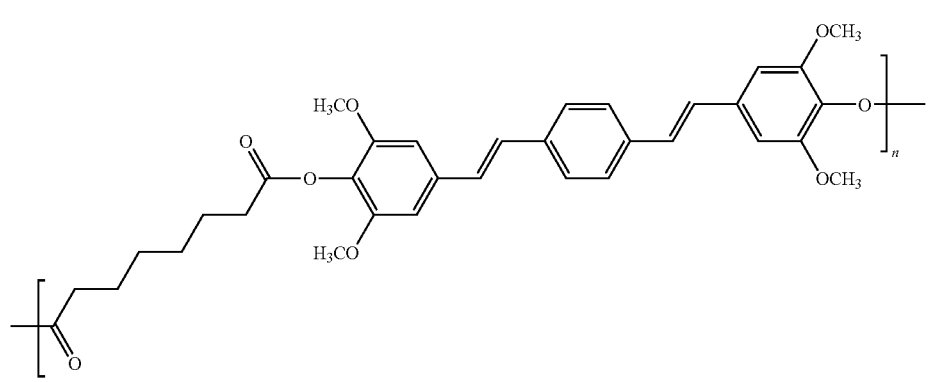
Ii

The sensitizers of formula (I) used in the present invention exhibit a strong yellow to greenish fluorescence.

The compounds of formula (I) used in the present invention can be prepared according to the process of Wittig polymerization well known to the person skilled in the art from a phosphonate and a bisaldehyde, for example analogously to the process described in Macromolecules 1999, 32, 7409-7413; the processes described therein can also be used for the synthesis of compounds not explicitly disclosed therein by varying the starting compounds accordingly. Other process variations on the Wittig polymerization using a phosphonium salt are e.g. described Macromolecules 2001, 33, 7426-7430 and Macromolecules 2001, 34, 4124-4129.

The sensitizers are used in combination with one or more coinitiators.

The amount of sensitizer(s) is not particularly restricted; however, it is preferably in the range of 0.2 to 25 wt.-%, based on the solids content or the dry layer weight of a coating produced from the composition, especially preferred 0.5 to 15 wt.-%.

It has been found that sensitizers with a symmetrical substitution pattern at ⑤ (i.e. a=b and $R^1=R^2$) are also suitable for two-photon excitation.

A coinitiator as referred to in the present invention is a compound that is essentially unable to absorb when irradiated but forms free radicals together with the radiation-absorbing sensitizers used in the present invention. The coinitiators are for example selected from onium compounds, for example those where the onium cation is selected from iodonium, sulfonium, phosphonium, oxysulfoxonium, oxysulfonium, sulfoxonium, ammonium, diazonium, selenonium, arsenonium and N-substituted N-heterocyclic onium cations wherein N is substituted with an optionally substituted alkyl, alkenyl, alkinyl or aryl; N-arylglycines and derivatives thereof (e.g. N-phenylglycine); aromatic sulfonyl halides; trihalomethylarylsulfones; imides such as N-benzoyloxyphthalimide; diazosulfonates; 9,10-dihydroanthracene derivatives; N-aryl, S-aryl or O-aryl polycarboxylic acids with at least two carboxy groups of which at least one is bonded to the nitrogen, oxygen or sulfur atom of the aryl unit (e.g. aniline diacetic acid and derivatives thereof and other coinitiators described in U.S. Pat. No. 5,629,354); hexaarylbiimidazoles; thiol compounds (e.g. mercaptobenzthiazole, mercaptobenzimidazole and mercaptotriazole); 1,3,5-triazine derivatives with 1 to 3 $CX_3$ groups (wherein every X is independently selected from a chlorine or bromine atom, and is preferably a chlorine atom), such as e.g. 2-phenyl-4,6-bis(trichloromethyl)-s-triazine, 2,4,6-tris(trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis-trichloromethyl-s-triazine, 2-(4-ethoxy-naphtho-1-yl)-4,6-bis(trichloromethyl)-s-triazine and 2-[4-(2-ethoxyethyl)-naphtho-1-yl]-4,6-bis(trichloromethyl)-s-triazine; oxime ethers and oxime esters, such as for example those derived from benzoin; metallocenes (preferably titanocenes, and especially preferred those with two five-membered cyclodienyl groups, such as e.g. cyclopentadienyl groups and one or two six-membered aromatic groups with at least one ortho fluorine atom and optionally also a pyrryl group, such as bis(cyclopentadienyl)-bis-[2,6-difluoro-3-(pyrr-1-yl)-phenyl]titanium and dicyclopentadiene-bis-2,4,6-trifluorophenyl-titanium or zirconium); acylphosphine oxides, diacylphosphine oxides and peroxides (e.g. those listed in EP-A1-1 035 435 as activators of the type of an organic peroxide).

Hexaarylbiimidazoles and onium compounds as well as mixtures thereof are preferred coinitiators.

Suitable hexaarylbiimidazoles are for example represented by the following formula (V):

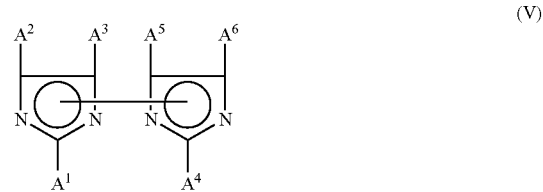

wherein $A^1$-$A^6$ are substituted or unsubstituted $C_5$-$C_{20}$ aryl groups which are identical or different from each other and in whose rings one or more carbon atoms can optionally be substituted by heteroatoms selected from O, N and S. Suitable substituents for the aryl groups are those that do not inhibit the light-induced dissociation to triarylimidazolyl radicals, e.g. halogen atoms (fluorine, chlorine, bromine, iodine), —CN, $C_1$-$C_6$ alkyl (optionally with one or more substituents selected from halogen atoms, —CN and —OH), $C_1$-$C_6$ alkoxy, $C_1$-$C_6$ alkylthio, ($C_1$-$C_6$ alkyl) sulfonyl.

Preferred aryl groups are substituted and unsubstituted phenyl, biphenyl, naphthyl, pyridyl, furyl and thienyl groups. Especially preferred are substituted and unsubstituted phenyl groups, and particularly preferred are halogen-substituted phenyl groups.

Examples include:
2,2'-bis(bromophenyl)-4,4',5,5'-tetraphenylbiimidazole,
2,2'-bis(p-carboxyphenyl)-4,4',5,5"-tetraphenylbiimidazole,
2,2'-bis(o-chlorophenyl)-4,4',5,5'-tetrakis(p-methoxyphenyl)-biimidazole,
2,2'-bis(p-chlorophenyl)-4,4',5,5'-tetrakis(p-methoxyphenyl)-biimidazole,
2,2'-bis(p-cyanophenyl)-4,4'5,5'-tetrakis(p-methoxyphenyl)-biimidazole,
2,2'-bis(2,4-dichlorophenyl)-4,4',5,5'-tetraphenylbiimidazole,
2,2'-bis(2,4-dimethoxyphenyl)-4,4',5,5'-tetraphenylbiimidazole,
2,2'-bis(o-ethoxyphenyl)-4,4',5,5'-tetraphenylbiimidazole,
2,2'-bis(m-fluorophenyl)-4,4',5,5'-tetraphenylbiimidazole,
2,2'-bis(o-fluorophenyl)-4,4',5,5'-tetraphenylbiimidazole,
2,2'-bis(p-fluorophenyl)-4,4',5,5'-tetraphenylbiimidazole,
2,2'-bis(o-hexoxyphenyl)-4,4',5,5'-tetraphenylbiimidazole,
2,2'-bis(o-hexylphenyl)-4,4',5,5'-tetrakis(p-methoxyphenyl)-biimidazole,
2,2'-bis(3,4-methylenedioxyphenyl)-4,4',5,5'-tetraphenylbiimidazole,
2,2'-bis(o-chlorophenyl)-4,4',5,5'-tetrakis(m-methoxyphenyl)biimidazole,
2,2'-bis(o-chlorophenyl)-4,4',5,5'-tetrakis[m-(betaphenoxyethoxyphenyl)]biimidazole,
2,2'-bis(2,6-dichlorophenyl)-4,4',5,5'-tetraphenylbiimidazole,
2,2'-bis(o-methoxyphenyl)-4,4',5,5'-tetraphenylbiimidazole,
2,2'-bis(p-methoxyphenyl)-4,4'-bis(o-methoxyphenyl)-5,5'-diphenylbiimidazole,
2,2'-bis(o-nitrophenyl)-4,4',5,5'-tetraphenylbiimidazole,
2,2'-bis(p-phenylsulfonylphenyl)-4,4',5,5'-tetraphenylbiimidazole,
2,2'-bis(p-sulfamoylphenyl)-4,4',5,5'-tetraphenylbiimidazole, 2,2'-bis(2,4,5-trimethylphenyl)-4,4',5,5'-tetraphenylbiimidazole,
2,2'-di-4-biphenylyl-4,4',5,5'-tetraphenylbiimidazole,
2,2'-di-1-naphthyl-4,4',5,5'-tetrakis(p-methoxyphenyl)-biimidazole,
2,2'-di-9-phenanthryl-4,4',5,5'-tetrakis(p-methoxyphenyl)-biimidazole,
2,2'-diphenyl-4,4',5,5'-tetra-4-biphenylylbiimidazole,
2,2'-diphenyl-4,4',5,5'-tetra-2,4-xylylbiimidazole,
2,2'-di-3-pyridyl-4,4',5,5'-tetraphenylbiimidazole,
2,2'-di-3-thienyl-4,4',5,5'-tetraphenylbiimidazole,
2,2'-di-o-tolyl-4,4',5,5'-tetraphenylbiimidazole,
2,2'-di-p-tolyl-4,4'-di-o-tolyl-5,5'-diphenylbiimidazole,
2,2'-di-2,4-xylyl-4,4',5,5'-tetraphenylbiimidazole,
2,2',4,4',5,5'-hexakis(p-phenylthiophenyl)biimidazole,
2,2',4,4',5,5'-hexa-1-naphthylbiimidazole,
2,2',4,4',5,5'-hexaphenylbiimidazole,
2,2'-bis(2-nitro-5-methoxyphenyl)-4,4',5,5'-tetraphenylbiimidazole,
2,2'-bis(o-nitrophenyl)-4,4',5,5'-tetrakis(m-methoxyphenyl)biimidazole,
2,2'-bis(2-chloro-5-sulfophenyl)-4,4',5,5'-tetraphenylbiimidazole,
2,2',5-tris(2-chlorophenyl)-4-(3,4-dimethoxyphenyl)-4,5'-diphenylbiimidazole,
2,2'-bis(o-chlorophenyl)-4,4',5,5'-tetraphenylbiimidazole,
2,2'-bis(o-chlorophenyl)-4,4',5,5'-tetra(p-fluorophenyl)biimidazole,
2,2'-bis(o-bromophenyl)-4,4',5,5'-tetra(p-iodophenyl)biimidazole,
2,2'-bis(o-chlorophenyl)-4,4',5,5'-tetra(p-chloronaphthyl)biimidazole,
2,2'-bis(o-chlorophenyl)-4,4',5,5'-tetra(p-chlorophenyl)biimidazole,
2,2'-bis(o-bromophenyl)-4,4',5,5'-tetra(p-chloro-p-methoxyphenyl)biimidazole,
2,2'-bis(o-chlorophenyl)-4,4',5,5'-tetra(o,p-dichlorophenyl)biimidazole,
2,2'-bis(o-chlorophenyl)-4,4',5,5'-tetra(o,p-dibromophenyl)biimidazole,
2,2'-bis(o-bromophenyl)-4,4',5,5'-tetra(o,p-dichlorophenyl)biimidazole or
2,2'-bis(o,p-dichlorophenyl)-4,4',5,5'-tetra(o,p-dichlorophenyl)biimidazole.

Suitable hexaarylbiimidazoles are for example described in U.S. Pat. No. 4,565,769 and U.S. Pat. No. 3,445,232 and can be prepared according to known methods, such as e.g. the oxidative dimerization of triarylimidazoles.

Suitable onium salts are for example described in U.S. Pat. No. 5,086,086. Onium salts wherein the onium cation is selected from iodonium, sulfonium, phosphonium, oxysulfoxonium, oxysulfonium, sulfoxonium, ammonium, diazonium, selenonium, arsenonium and N-substituted N-heterocyclic onium cations, wherein N is substituted with an optionally substituted alkyl, alkenyl, alkinyl or aryl, are preferred.

The anion of the onium salt can for example be chloride or a non-nucleophilic anion such as tetrafluoroborate, hexafluorophosphate, hexafluoroarsenate, hexafluoroantimonate, triflate, tetrakis(pentafluorophenyl)borate, pentafluoroethylsulfonate, p-methylbenzylsulfonate, ethylsulfonate, trifluoromethylacetate and pentafluoroethylacetate.

Typical onium salts that can be used as coinitiators include for example diphenyliodonium chloride, diphenyliodonium-hexafluorophosphate, diphenyliodonium-hexafluorophosphate, diphenyliodonium-hexafluoroantimonate, 4,4'-dicumyliodoniumchloride, 4,4'-dicumyliodonium-hexafluorophosphate, N-methoxy-α-picolinium-p-toluenesulfonate, 4-meth-oxybenzene-diazonium-tetrafluoroborate, 4,4'-bis-dodecylphenyliodonium-hexafluorophosphate, 2-cyanoethyl-triphenylphosphonium chloride, bis-[4-diphenylsulfoniumphenyl]-sulfide-bis-hexafluorophosphate, bis-4-dodecylphenyliodonium-hexafluoroantimonate and triphenylsulfonium-hexafluoroantimonate.

In the present invention, one of the above-mentioned coinitiators or a mixture thereof can be used.

The amount of coinitiator(s) is not particularly restricted; however, it is preferably in the range of 0.2 to 25 wt.-%, based on the dry layer weight, especially preferred 0.5 to 15 wt.-%.

Optionally, the radiation-sensitive coating of the present invention can also comprise an alkali-soluble binder or a mixture of such binders. The binder is preferably selected from polyvinyl acetals, acrylic polymers, polyurethanes and copolymers thereof. It is preferred that the binder contains acid groups, especially preferred carboxy groups. Most preferred are acrylic polymers. Binders with acid groups preferably have acid numbers in the range of 20 to 180 mg KOH/g polymer. Optionally, the binder can comprise groups that are capable of undergoing a cycloaddition (e.g. a 2+2-photocycloaddition). The amount of binder is not particularly restricted and is preferably in the range of 0 to 90 wt.-%, especially preferred 5 to 60 wt.-%, based on the dry layer weight.

The radiation-sensitive coating can optionally also comprise small amounts of a thermopolymerization inhibitor. Suitable examples of inhibitors to prevent an undesired thermopolymerization include e.g. hydroquinone, p-methoxyphenol, di-t-butyl-p-cresol, pyrrogallol, t-butylcatechol, benzoquinone, 4,4'-thio-bis-(3-methyl-6-t-butylphenol), 2,2'-methylene-bis-(4-methyl-6-t-butylphenol) and N-nitrosophenylhydroxylamine salts. The amount of polymerization inhibitor in the radiation-sensitive coating is preferably 0 to 5 wt.-%, based on the dry layer weight, especially preferred 0.01 to 2 wt.-%. Such inhibitors are often introduced into the radiation-sensitive coating via commercial monomers or oligomers and are therefore not expressly mentioned.

Furthermore, the radiation-sensitive coating of the present invention can comprise dyes or pigments for coloring the layer (contrast dyes and pigments). Examples of colorants include e.g. phthalocyanine pigments, azo pigments, carbon black and titanium dioxide, triarylmethane dyes, such as ethyl violet and crystal violet, azo dyes, anthraquinone dyes and cyanine dyes. The amount of colorant is preferably 0 to 20 wt.-%, based on the dry layer weight, especially preferred 0.5 to 10 wt.-%.

For improving the physical properties of the hardened layer, the radiation-sensitive coating can additionally comprise further additives such as plasticizers or inorganic fillers. Suitable plasticizers include e.g. dibutyl phthalate, dioctyl phthalate, didodecyl phthalate, dioctyl adipate, dibutyl sebacate, triacetyl glycerin and tricresyl phosphate. The amount of plasticizer is not particularly restricted, however, it is preferably 0 to 10 wt.-%, based on the dry layer weight, especially preferred 0.25 to 5 wt.-%. Suitable inorganic fillers include for example $Al_2O_3$ and $SiO_2$; they are preferably present in an amount of 0 to 20 wt.-%, based on the dry layer weight, especially preferred 0.1 to 5 wt.-%.

The radiation-sensitive coating can also comprise known chain transfer agents. They are preferably used in an amount of 0 to 15 wt.-%, based on the dry layer weight, especially preferred 0.5 to 5 wt.-%.

Furthermore, the radiation-sensitive coating can comprise leuco dyes such as e.g. leuco crystal violet and leucomalachite green. They are preferably present in an amount of 0 to 10 wt.-%, based on the dry layer weight, especially preferred 0.5 to 5 wt.-%.

Additionally, the radiation-sensitive coating can comprise surfactants (flow improvers). Suitable surfactants include siloxane-containing polymers, fluorine-containing polymers and polymers with ethylene oxide and/or propylene oxide groups. They are preferably present in an amount of 0 to 10 wt.-%, based on the dry layer weight, especially preferred 0.2 to 5 wt.-%.

Exposure indicators, such as e.g. 4-phenylazodiphenylamine, can also be present as optional components of the radiation-sensitive coating; they are preferably present in an amount of 0 to 5 wt.-%, especially preferred 0 to 2 wt.-%, based on the dry layer weight.

In the production of the lithographic printing plate precursors of the present invention, a dimensionally stable plate or foil-shaped material, including a material in the form of a press element which is known as a suitable lithographic substrate, is preferably used as a substrate. Examples of such substrates include paper, paper coated with plastic materials (such as polyethylene, polypropylene, polystyrene), a metal plate or foil, such as e.g. aluminum (including aluminum alloys), zinc and copper plates, plastic films made e.g. from cellulose diacetate, cellulose triacetate, cellulose propionate, cellulose acetate, cellulose acetatebutyrate, cellulose nitrate, polyethylene terephthalate, polyethylene, polystyrene, polypropylene, polycarbonate and polyvinyl acetate, and a laminated material made from paper or a plastic film and one of the above-mentioned metals, or a paper/plastic film that has been metallized by vapor deposition. Among these substrates, an aluminum plate or foil is especially preferred since it shows a remarkable degree of dimensional stability, is inexpensive and furthermore exhibits excellent adhesion to the coating. Furthermore, a composite film can be used wherein an aluminum foil has been laminated onto a polyethylene terephthalate film.

The lithographic substrate either has a naturally hydrophilic surface or is subjected to a treatment generating such a surface.

A metal substrate, in particular an aluminum substrate, is preferably subjected to at least one treatment selected from graining (e.g. by brushing in a dry state or brushing with abrasive suspensions, or electrochemical graining, e.g. by means of a hydrochloric acid electrolyte), anodizing (e.g. in sulfuric acid or phosphoric acid) and application of a hydrophilizing layer.

In order to improve the hydrophilic properties of the surface of the metal substrate that has been grained and optionally anodized in sulfuric acid or phosphoric acid, the metal substrate can be subjected to an aftertreatment with an aqueous solution of sodium silicate, calcium zirconium fluoride, polyvinylphosphonic acid or phosphoric acid. Within the framework of the present invention, the term "substrate" also encompasses an optionally pre-treated substrate exhibiting, for example, a hydrophilizing layer on its surface.

The details of the above-mentioned substrate pre-treatment are known to the person skilled in the art.

For producing a lithographic printing plate precursor according to the present invention, the radiation-sensitive composition is applied to the hydrophilic surface of the substrate by means of common coating processes (e.g. spin coating, spray coating, dip coating, coating by means of a doctor blade). It is also possible to apply the radiation-sensitive composition on both sides of the substrate; however, for the elements of the present invention, it is preferred that the radiation-sensitive coating be only applied to one side of the substrate.

Usually, the radiation-sensitive composition is applied from an organic solvent or solvent mixture.

Suitable solvents include low alcohols (e.g. methanol, ethanol, propanol and butanol), glycolether derivatives (e.g. ethylene glycol monomethylether, ethylene glycol dimethylether, propylene glycol monomethylether, ethylene glycol monomethylether acetate, ethylene glycol monoethylether acetate, propylene glycol monomethylether acetate, propylene glycol monoethylether acetate, ethylene glycol monoisopropylether acetate, ethylene glycol monobutylether acetate, diethylene glycol monomethylether, diethylene glycol monoethylether), ketones (e.g. diacetone alcohol, acetyl acetone, acetone, methyl ethyl ketone, cyclohexanone, methyl isobutyl ketone), esters (e.g. methyl lactate, ethyl lactate, ethyl acetate, 3-methoxypropyl acetate and butyl acetate), aromatics (e.g. toluene and xylene), cyclohexane, 3-methoxy-2-propanol, 1-methoxy-2-propanol, methoxymethoxyethanol, γ-butyrolactone and dipolar aprotic solvents (e.g. THF, dimethylsulfoxide, dimethylformamide and N-methylpyrrolidone) and mixtures thereof. The solids content of the radiation-sensitive mixture to be applied depends on the coating method that is used and is preferably 1 to 50 wt.-%.

The dry layer weight of the radiation-sensitive layer is preferably 0.5 to 4 $g/m^2$, more preferably 0.8 to 3 $g/m^2$.

The additional application of a water-soluble oxygen-impermeable overcoat onto the radiation-sensitive layer can be advantageous. The polymers suitable for such an overcoat include, inter alia, polyvinyl alcohol, polyvinyl alcohol/polyvinyl acetate copolymers, polyvinyl pyrrolidone, polyvinyl pyrrolidone/polyvinyl acetate copolymers, polyvinyl methylethers, ring-opened copolymers of maleic acid anhydride and a comonomer such as methylvinylether, polyacrylic acid, cellulose ether, gelatin, etc.; polyvinyl alcohol is preferred. Preferably, the composition for the oxygen-impermeable overcoat is applied in the form of a solution in water or in a solvent miscible with water; in any case, the solvent is selected such that the radiation-sensitive coating already present on the substrate essentially does not dissolve upon application of the overcoat composition. The layer weight of the overcoat can e.g. be 0.1 to 6 $g/m^2$, preferably 0.5 to 4 $g/m^2$. However, the printing plate precursors according to the present invention show excellent properties even without an overcoat. The overcoat can also comprise matting agents (i.e. organic or inorganic particles with a particle size of 2 to 20 μm) which facilitate the planar positioning of the film during contact exposure. In order to improve adhesion of the overcoat to the radiation-sensitive layer, the overcoat can comprise adhesion promoters such as e.g. poly(vinylpyrrolidone), poly(ethyleneimine) and poly(vinylimidazole).

Suitable overcoats are described for example in WO 99/06890.

The thus produced lithographic printing plate precursors are image-wise exposed in a manner known to the person skilled in the art with radiation of a wavelength of >300 nm (preferably 350 to 450 nm) and subsequently developed with a commercially available aqueous alkaline developer. UV laser diodes emitting UV radiation in the range of about 405 nm (e.g. 405±10 nm) are of particular interest as a radiation source. In addition to ns- and ps-lasers, fs-lasers can be used as well for imaging the lithographic printing plate precursors of the present invention since the sensitizers used in the present invention are capable of simultaneous two-photon excitation. As a rule, fs-lasers provide pulses with a pulse width of <200 fs, a frequency of >70 MHz and an emission wavelength in the range of 710 to 950 nm. The multi-photon-initiated polymerization has the advantage that a higher resolution can be achieved compared to the one-photon process.

After image-wise exposure, i.e. prior to developing, a heat treatment can be carried out at 50 to 180° C., preferably 90 to 150° C. The developed elements can be treated with a preservative ("gumming") using a common method. The preservatives are aqueous solutions of hydrophilic polymers, wetting agents and other additives.

For certain applications (e.g. in the case of printing plates), it is furthermore advantageous to increase the mechanical strength of the portions of the coating remaining after developing by subjecting them to a heat treatment (what is referred to as "baking") and/or a combination of baking and overall exposure (e.g. to UV light). For this purpose, prior to the treatment, the developed element is treated with a solution that protects the non-image areas such that the heat treatment does not cause these areas to accept ink. A solution suitable for this purpose is e.g. described in U.S. Pat. No. 4,355,096. Baking takes place at a temperature in the range of 150 to 250° C. However, elements such as printing plates prepared from radiation-sensitive elements according to the present invention show excellent properties even without having been subjected to a heat treatment. When both baking and overall exposure are carried out, the two treatment steps can be performed simultaneously or one after the other.

The radiation-sensitive elements according to the present invention are characterized by excellent stability under yellow light conditions, a high degree of photosensitivity and excellent resolution in combination with good storage stability. In the case of printing plate precursors, the developed printing plates exhibit excellent abrasion resistance which allows a high print run length. The radiation-sensitive layer exhibits a good resistance to acids which are for example formed during photolysis or present as acidic groups in a binder.

The invention will be explained in more detail in the following examples; however, they shall not restrict the invention in any way.

EXAMPLES

Synthesis of the Sensitizers

The synthesis of the copolymers used in the examples was carried out according to the following reaction scheme of the Wittig-Horner-Emmons condensation reaction using the dialdehyde and the corresponding diphosphonate:

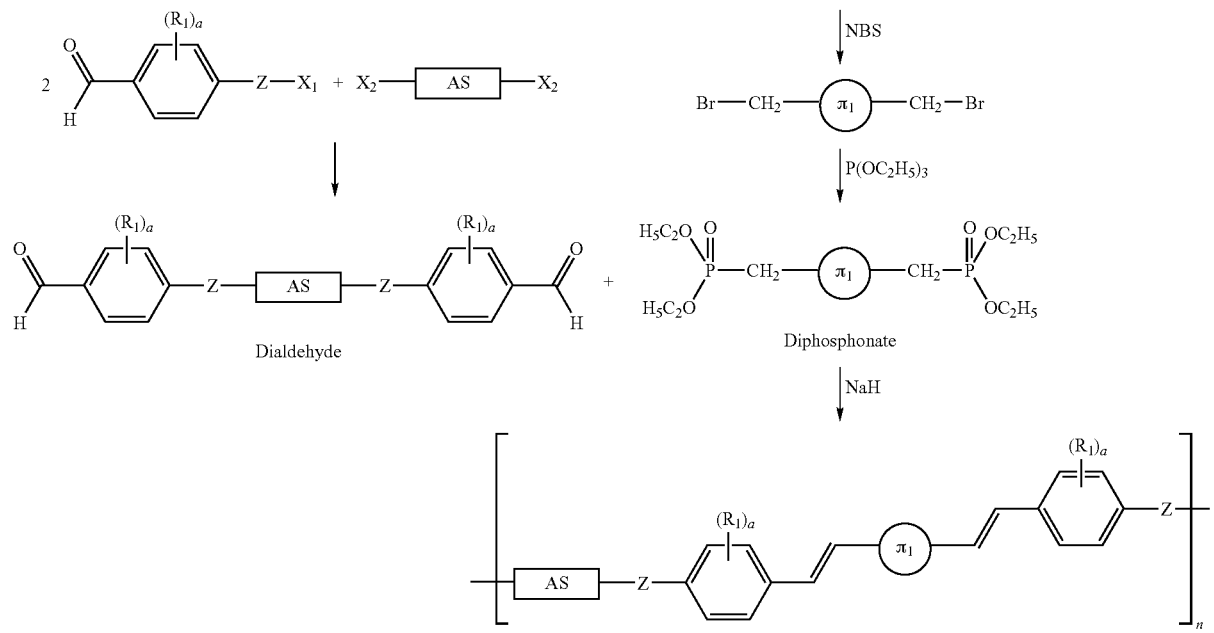

The synthesis of the dialdehyde was carried out using standard processes (nucleophilic substitution, esterification) which are well known to the person skilled in the art. For this purpose, 2 moles of an aldehyde

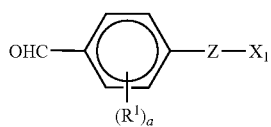

were reacted with a compound comprising two reactive groups $X_2$ which, under suitable conditions, react with the aldehyde (e.g. by nucleophilic substitution or esterification).

The diphosphonate was obtained by reacting the dibromide Br—$CH_2$-⑨-$CH_2$—Br with triethylphosphite ($P(OC_2H_5)_3$). Excess triethylphosphite was evaporated off in a vacuum; the dibromide had been obtained by bromination of the corresponding dimethyl-substituted aromatic wherein N-bromosuccinimide (NBS) was used as brominating agent. The reaction with the triethylphosphite was carried out at 60° C., with azobisisobutyronitrile (AIBN) having been used as chain initiator for the free-radical bromination.

For the synthesis of the sensitizers I, a 500 ml flask which had previously been carefully dried and was equipped with a gas inlet pipe, a cooler with drying tube and a drip funnel was saturated with protective gas. This was done by purging with inert gas which was continued throughout the entire synthesis. Then 0.01 moles sodium hydride (0.01 moles is the total amount necessary for the reaction which was present as a 60% suspension in oil) and 200 ml dried THF were added under vigorous stirring. Then 0.01 moles of the diphosphonate, which was first dissolved in 40 ml dry THF, were added and stirring was continued at room temperature for another 20 minutes. Subsequently, 0.01 moles of the dialdehyde, which was first dissolved in 20 ml THF, were added. The resulting mixture was then stirred for 48 hours at room temperature. Then 30 ml water were carefully added to stop the reaction. The resulting solution was then extracted several times with chloroform until the chloroform was visually unable to take up any more organic substances. The combined extracts were then concentrated in a rotary evaporator until only a small solvent residue was present. The residue was then added to at least 1 l methanol, causing the polymer to precipitate. The precipitated polymer was withdrawn and dried in a vacuum. Details regarding the starting materials can be inferred from Table 1. The GPC results for sensitizer Ia are shown in FIG. 1.

TABLE 1

| Sensitizer | $R^1$ | a | Z | AS | $\pi_1$ | $X_1$ | $X_2$ |
|---|---|---|---|---|---|---|---|
| Ia | $OCH_3$ | 2 | O | —$(CH_2)_8$— |  | H | Br |
| Ib | $OCH_3$ | 2 | O | —$(CH_2)_8$— | 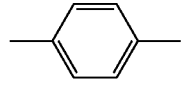 | H | Br |
| Ic | $OCH_3$ | 2 | O | —$(CH_2)_8$— | 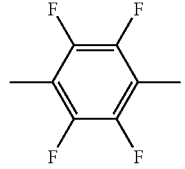 | H | Br |
| Id | $OCH_3$ | 2 | O | —$(CH_2)_8$— | 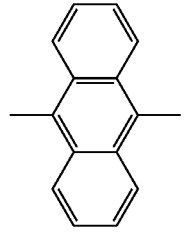 | H | Br |
| Ie | $OCH_3$ | 2 | O | —$(CH_2)_8$— | 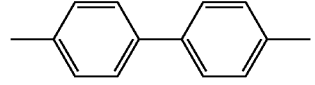 | H | Br |
| If | $OCH_3$ | 2 | O | —$(CH_2)_8$— | 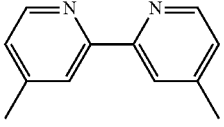 | H | Br |
| Ig | $OCH_3$ | 2 | O | —$(CH_2)_8$— | 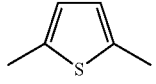 | H | Br |
| Ih | $OCH_3$ | 2 | O | —{$(CH_2)_2$—O}$_2$—$(CH_2)_2$— | 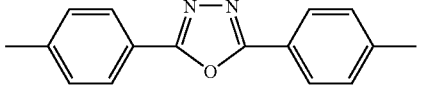 | H | Br |
| Ii | $OCH_3$ | 2 | O | —CO—$(CH_2)_6$—CO— | 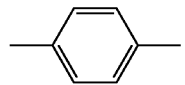 | H | Cl |

Examples 1 to 6 and Comparative Example 1

An electrochemically grained (in HCl) and anodized aluminum foil was subjected to a treatment with an aqueous solution of polyvinylphosphonic acid (PVPA) and, after drying, coated with a solution as described below and dried:

1.02 g of a terpolymer prepared by polymerization of 470 parts by weight styrene, 336 parts by weight methyl methacrylate and 193 parts by weight methacrylic acid, 30% solution in propylene glycol monomethylether 0.1 g Kayamer PM-2 (1 mole phosphoric acid esterified with 1.5 moles hydroxyethyl methacrylate from Coa Corp. Ltd., Japan)

0.2 g mercapto-3-triazole 3.92 g of an 80% methyl ethyl ketone solution of a urethane acrylate prepared by reacting Desmodur N 100® (available from Bayer) with hydroxyethyl acrylate and pentaerythritol triacrylate; amount of double bonds: 0.5 double bonds per 100 g when all isocyanate groups have completely reacted with the acrylates containing hydroxy groups 0.45 g ditrimethylolpropane tetraacrylate 1.25 g of a dispersion in propylene glycol monomethylether comprising 7.25 wt.-% copper phthalocyanine and 7.25 wt.-% of a polyvinylacetal binder comprising 39.9 mole-% vinyl alcohol groups, 1.2 mole-% vinyl acetate groups, 15.4 mole-% acetal groups derived from acetaldehyde, 36.1 mole-% acetal groups derived from butyric aldehyde and 7.4 mole-% acetal groups derived from 4-formylbenzoic acid Y g coinitiator according to Table 2

X g sensitizer according to Table 2

20 ml propylene glycol monomethylether 16 ml methanol 25 ml methyl ethyl ketone

The solution was filtered, applied to the lithographic substrate and the coating was dried for 4 minutes at 90° C. The dry layer weight of the photopolymer layer was about 1.5 g/m².

The obtained samples were coated with an overcoat by applying an aqueous solution of poly(vinylalcohol) (Airvol 203 available from Airproducts; degree of hydrolysis: 88%); after drying for 4 minutes at 90° C., the overcoat had a dry layer weight of about 3 g/m².

The printing plate precursor was exposed with a tungsten lamp having a metal interference filter for 405 nm through an UGRA gray scale in order to obtain at least one gray scale step. Immediately after exposure, the plate was heated in an oven for 2 minutes at 90° C.

Then, the exposed plate was treated for 30 seconds with an aqueous developer solution having a pH value of 12 and comprising KOH as an alkaline component as well as a tenside (poly(ethylene glycol)naphthylether).

Then the developer solution was again rubbed over the surface for another 30 seconds using a tampon and then the entire plate was rinsed with water. After this treatment, the exposed portions remained on the plate. For the assessment of its photosensitivity, the plate was blackened in a wet state with printing ink.

For the assessment of the storage stability of the plates, the unexposed printing plate precursors were stored for 60 minutes in a 90° C. oven, then exposed and developed as described above (storage stability test).

For the preparation of a lithographic printing plate, a printing layer was applied to the aluminum foil, as explained above, exposed, heated, developed, and after rinsing with water, the developed plate was rubbed and gummed with an aqueous solution of 0.5% phosphoric acid and 6% gum arabic. The thus prepared plate was loaded in a sheet-fed offset printing machine and used for printing with an abrasive printing ink (Offset S 7184® available from Sun Chemical, containing 10% potassium carbonate). The results are summarized in Table 2.

The results in Table 2 show that by using a sensitizer of formula (I), printing plates with a high degree of sensitivity (both in the case of fresh plates and in the case of aged plates) can be obtained which can be used for high print run lengths.

TABLE 2

| Example | Type of sensitizer | Amount of sensitizer in g | Type of coinitiator | Amount of coinitiator in g | Exposure energy at 405 nm[1] (μJ/cm²) | Exposure energy at 405 nm[2] (μJ/cm²) | Printing results |
|---|---|---|---|---|---|---|---|
| 1 | Ia | 0.05 | o-Cl-Habi[3] | 0.175 | 40 | 50 | no abrasion up to 50,000 copies |
| 2 | Ia | 0.05 | Iodonium salt[4] | 0.175 | 50 | 60 | no abrasion up to 50,000 copies |
| 3 | Ib | 0.05 | o-Cl-Habi[3] | 0.175 | 70 | 90 | no abrasion up to 50,000 copies |
| 4 | Id | 0.05 | o-Cl-Habi[3] | 0.175 | 50 | 65 | no abrasion up to 50,000 copies |
| 5 | Ig | 0.05 | Iodonium salt[4] | 0.175 | 70 | 105 | no abrasion up to 50,000 copies |
| 6 | Ih | 0.05 | Iodonium salt[4] | 0.175 | 80 | 100 | no abrasion up to 50,000 copies |
| Comp. Ex. 1 (EP 1349006) | Ref. 1 | 0.10 | o-Cl-Habi[3] | 0.175 | 260 | 320 | visible abrasion after 5,000 copies |

[1] Energy required to obtain one step of an UGRA gray scale on a fresh plate
[2] Storage stability test: Energy required to obtain one step of an UGRA gray scale on a plate that has been stored for 60 minutes at 90° C.
[3] 2,2-Bis-(2-chlorophenyl)-4,5,4',5'-tetraphenyl-2'H-[1,2']biimidazolyl
[4] Diphenyliodonium chloride

The invention claimed is:

1. Lithographic printing plate precursor comprising
   (a) a lithographic substrate with a hydrophilic surface and
   (b) a radiation-sensitive coating on the hydrophilic surface comprising
      (i) one or more types of monomers and/or oligomers and/or polymers, each comprising at least one ethylenically unsaturated group accessible to a free-radical polymerization,
      (ii) at least one sensitizer, and (iii) at least one coinitiator capable of forming free radicals together with the sensitizer (ii);

characterized in that the at least one sensitizer is an oligomeric or polymeric compound comprising the following structural unit

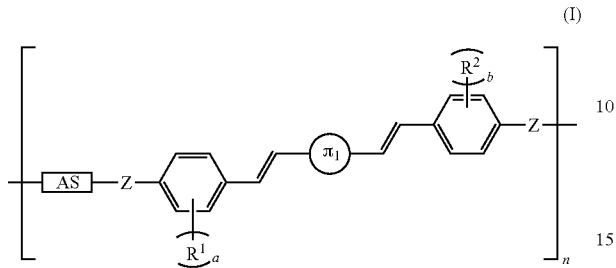

(I)

wherein ⑤ is an aromatic or heteroaromatic unit or a combination of the two so that a conjugated π-system is present between the two groups Z in structure (I), each Z independently represents a heteroatom, each $R^1$ and $R^2$ is independently selected from a halogen atom, an alkyl, aryl, alkylaryl or aralkyl group, a group —$NR^3R^4$ and a group —$OR^5$, each $R^3$, $R^4$ and $R^5$ is independently selected from an alkyl, aryl, alkylaryl and aralkyl group, a and b independently represent 0 or an integer from 1 to 4, n has a value of >1 and AS is an aliphatic spacer, siloxane unit, or a silane unit.

2. Lithographic printing plate precursor according to claim 1 wherein ⑤ is selected from a benzene, naphthalene, anthracene, fluoren, biphenyl, carbazole, furan, dibenzofuran, thiophene, dibenzothiophene, dithienothiophene, oxadiazole, thiadiazole, pyridine, pyrimidine and triazine unit as well as any combination of two or more of the above units which may be the same or different, any of which can optionally comprise one or more substituents.

3. Lithographic printing plate precursor according to claim 1 wherein each Z is independently selected from N, S, O and Si.

4. Lithographic printing plate precursor according to claim 1 wherein AS is selected from a group

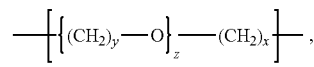

wherein x and y independently represent an integer of at least 1 and z represents 0 or an integer of at least 1, a group

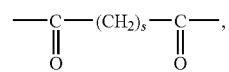

wherein s is an integer of at least 1, a siloxane unit and a silane unit.

5. Lithographic printing plate precursor according to claim 1 wherein Z in formula (I) is O.

6. Lithographic printing plate precursor according to claim 1 wherein

⑤ in formula (I) is derived from a benzene or biphenyl or represents

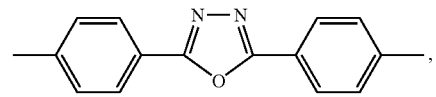

any of which can optionally comprise one or more substituents.

7. Lithographic printing plate precursor according to claim 1 wherein in formula (I) $R^1=R^2$ and a=b.

8. Lithographic printing plate precursor according to claim 1 wherein the aliphatic spacer AS in formula (I) is selected from —CO—$(CH_2)_4$—CO—, —$(CH_2)_8$— and —{$(CH_2)_2$—O}$_2$—$(CH_2)_2$—

9. Lithographic printing plate precursor according to claim 1 wherein the sensitizer has an average molecular weight of at least 1,000 g/mole.

10. Lithographic printing plate precursor according to claim 1 wherein the sensitizer does not comprise any other structural units in addition to the structural unit (I).

11. Lithographic printing plate precursor according to claim 1 wherein the sensitizer comprises one or more of the structural units (Ia) to (Ii):

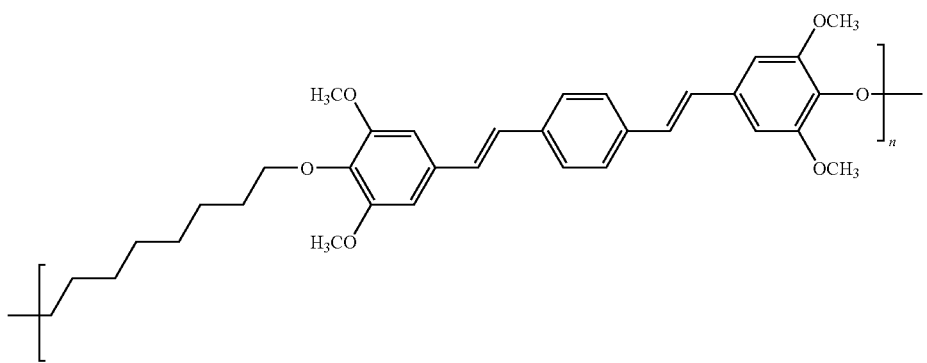

Ia

-continued
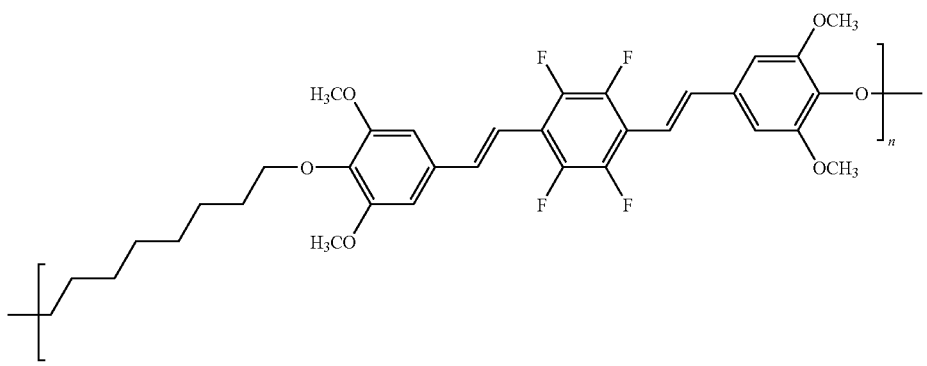
Ib
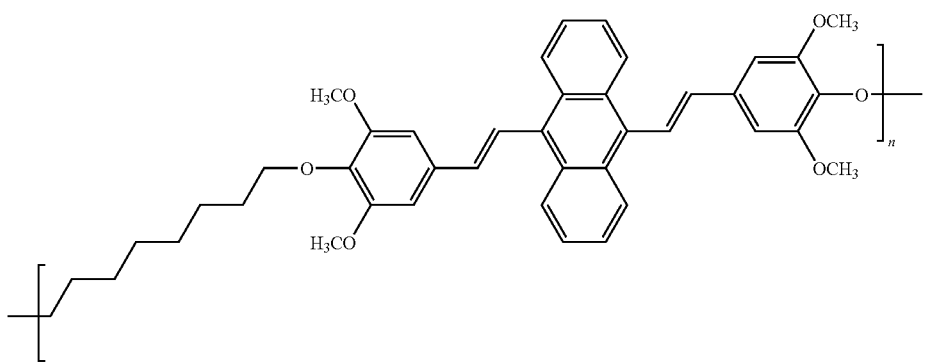
Ic
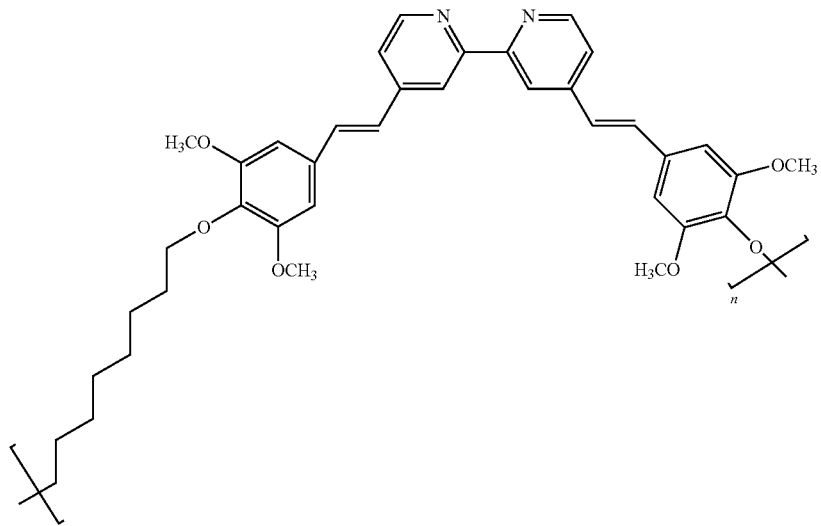
Ie
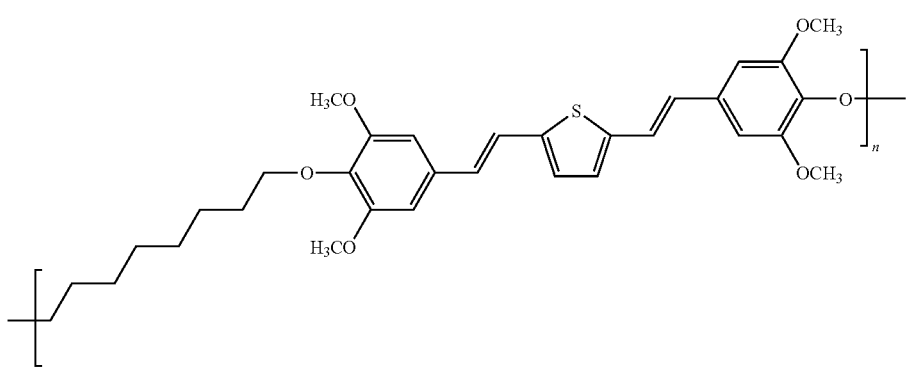
If

-continued

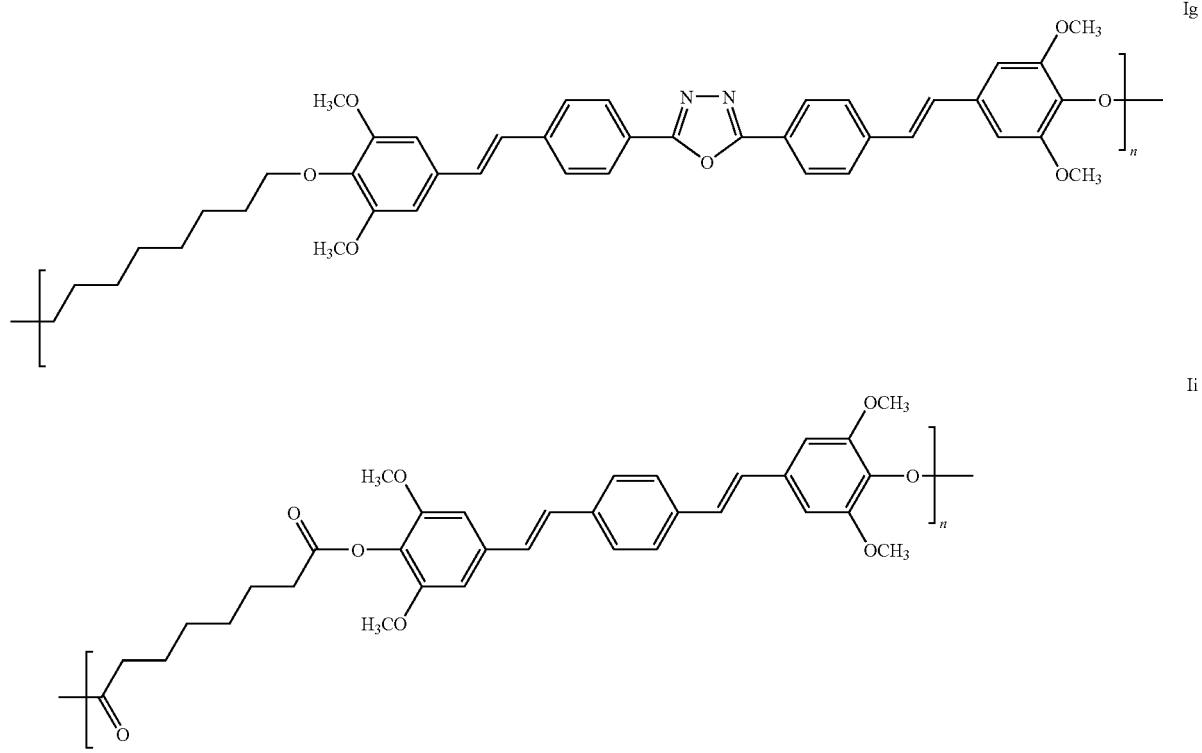

12. Lithographic printing plate precursor according to claim 1 wherein the coinitiator (iii) is selected from the following compounds: metallocenes; 1,3,5-triazine derivatives with one to three $CX_3$ groups, wherein X represents chlorine or bromine; peroxides; hexaarylbiimidazoles; oxime ethers; oxime esters; N-aryl glycines and derivatives thereof; thiol compounds; N-aryl, S-aryl and O-aryl polycarboxylic acids with at least 2 carboxyl groups of which at least one is bonded to the N, S or O atom of the aryl unit; onium salts; alkyltriarylborates; benzoin ethers; benzoin esters; trihalogenomethylarylsulfones; amines; N,N-dialkylaminobenzoic acid esters; aromatic sulfonyl halides; imides; diazosulfonates; 9,10-dihydroanthracene derivatives; acylphosphine oxides; diacylphosphine oxides; α-hydroxy and α-amino acetophenones.

13. Lithographic printing plate precursor according to claim 1 wherein the element furthermore comprises an oxygen-impermeable overcoat layer.

14. Process for imaging a lithographic printing plate precursor according to claim 1 comprising
   (a) providing a lithographic printing plate precursor as defined in claim 1;
   (b) image-wise exposure of the precursor to UV radiation of >300 nm;
   (c) removing the non-exposed areas of the coating by means of an aqueous alkaline developer.

15. Process according to claim 14, wherein the exposed precursor obtained in step (b) is heated prior to step (c).

16. Process according to claim 14 wherein the developed precursor obtained in step (c) is subsequently subjected to at least one treatment selected from heating and overall exposure.

17. Process according to claim 14 wherein image-wise exposure is carried out with UV radiation of a wavelength in the range of 350 to 450 nm.

18. Imaged printing form obtainable according to the process of claim 14.

19. Process for the production of a radiation-sensitive lithographic printing plate precursor according to claim 1 comprising
   (a) providing a lithographic substrate with a hydrophilic surface,
   (b) providing a radiation-sensitive coating comprising
      (i) one or more types of monomers and/or oligomers and/or polymers, each comprising at least one ethylenically unsaturated group accessible to a free-radical polymerization,
      (ii) at least one sensitizer,
      (iii) at least one coinitiator capable of forming free radicals together with the sensitizer (ii) and
      (iv) at least one solvent,
   characterized in that the at least one sensitizer is an oligomeric or polymeric compound comprising the following structural unit (I):

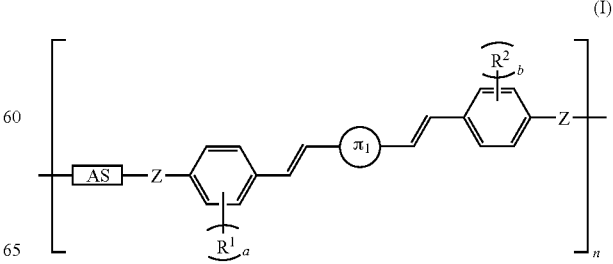

wherein Ⓢ is an aromatic or heteroaromatic unit or a combination of the two so that a conjugated π-system is present between the two groups Z in structure (I), each Z independently represents a heteroatom, each $R^1$ and $R^2$ is independently selected from a halogen atom, an alkyl, aryl, alkylaryl or aralkyl group, a group —$NR^3R^4$ and a group —$OR^5$, each $R^3$, $R^4$ and $R^5$ is independently selected from an alkyl, aryl, alkylaryl and aralkyl group, a and b independently represent 0 or an integer from 1 to 4, n has a value of >1 and AS is an aliphatic spacer, a siloxane unit, or a silane unit, (c) applying the radiation-sensitive composition onto the hydrophilic surface of the lithographic substrate and (d) drying.

20. Process according to claim 19, wherein the substrate provided in step (a) is an aluminum substrate that has been subjected to at least one treatment selected from graining, anodizing and hydrophilizing.

* * * * *